United States Patent [19]

Rue

[11] Patent Number: 4,695,803
[45] Date of Patent: Sep. 22, 1987

[54] HID LAMP BALLAST TESTER

[75] Inventor: Robert H. Rue, Christiansburg, Va.

[73] Assignee: Harvey Hubbell Incorporated, Orange, Conn.

[21] Appl. No.: 825,772

[22] Filed: Feb. 3, 1986

Related U.S. Application Data

[63] Continuation of Ser. No. 523,105, Aug. 15, 1983, abandoned.

[51] Int. Cl.⁴ .................. G01R 31/00; G01R 1/22
[52] U.S. Cl. ........................ 324/403; 315/129; 324/127; 324/414
[58] Field of Search ............ 324/127, 414, 437, 403; 313/315; 315/129, 135

[56] References Cited

U.S. PATENT DOCUMENTS 672,019  4/1901  Sinding-Larsen .......... 313/315
1,552,121  9/1925  Dau .......................... 313/315
4,496,905  1/1985  Forte et al. ................ 324/414

OTHER PUBLICATIONS

Marks, "Standard Handbook for Mechanical Engineers", p. 15-7.
Sylvania, "Incandescent Lamps", pp. 1-6.
IES Lighting Handbook, 1984 Reference Volume, p. 8-72.

Primary Examiner—Ernest F. Karlsen
Attorney, Agent, or Firm—Jerry M. Presson; Walter C. Farley

[57] ABSTRACT

A ballast tester for HPS lamp circuits includes a body of insulating material, a base which fits the lamp socket, a single wire connected to the base and extending through the body forming a loop, and a hole in the body within the loop to receive a clamp-on ammeter. The ammeter measures short-circuit current, giving an indication of ballast condition.

5 Claims, 6 Drawing Figures

HID LAMP BALLAST TESTER

This application is a continuation of application Ser No. 523,105, filed Aug. 15, 1983, now abandoned.

This invention relates to a testing device for lamp ballasts and particularly to a tester for determining the condition of a ballast for a high intensity discharge (HID) lamp.

BACKGROUND OF THE INVENTION

Lamp ballasts have generally been tested by measuring the voltage at the lamp socket. This kind of testing is satisfactory when checking ballasts used with mercury vapor or metal halide lamps but does not work well with high pressure sodium (HPS) lamp ballasts. When checking HPS lamp ballasts it is necessary to connect a low pass filter at the input of the voltmeter to prevent the meter from being damaged by very high voltage peaks which can occur if the starter circuit is good.

Then, if the initial voltage reading shows that the ballast is good, another probe must be used to determine the voltage produced by the starter circuit. Thus, the field electrician needs to carry at least two special test instruments. Furthermore, the circuitry for the starter probe is very complex and densely packed in currently available instruments.

BRIEF SUMMARY OF THE INVENTION

An object of the present invention is to provide a small, lightweight, durable and relatively inexpensive test device which is usable with a standard clamp-on ammeter to reliably test ballasts for HPS lamps.

A further object is to provide a safe technique for short-circuiting the output of the ballastry means at the lamp socket and for measuring the current in that short-circuit to quickly and easily check the ballast condition.

Briefly described, the invention comprises a testing device for use with a clamp-on ammeter to measure the short-circuit current output of a circuit connected to a lamp socket, comprising a body of electrically nonconductive material; a head portion fixedly attached to said body, said head portion having means defining an opening therethrough dimensioned to receive the current-sensing arms of a clamp-on ammeter; a base attached to said body, said base including contact portions adapted to mate with the socket to be tested; and a low resistance wire connected at opposite ends to said connector portions of said base and extending around said opening to be coupled to said ammeter and to form a short-circuit across said socket.

In order that the manner in which the foregoing and other objects are attained in accordance with the invention can be understood in detail, particularly advantageous embodiments thereof will be described with reference to the accompanying drawings, which form a part of this specification, and wherein.

DETAILED DESCRIPTION OF PREFERRED EMBODIMENT

Figure 1:
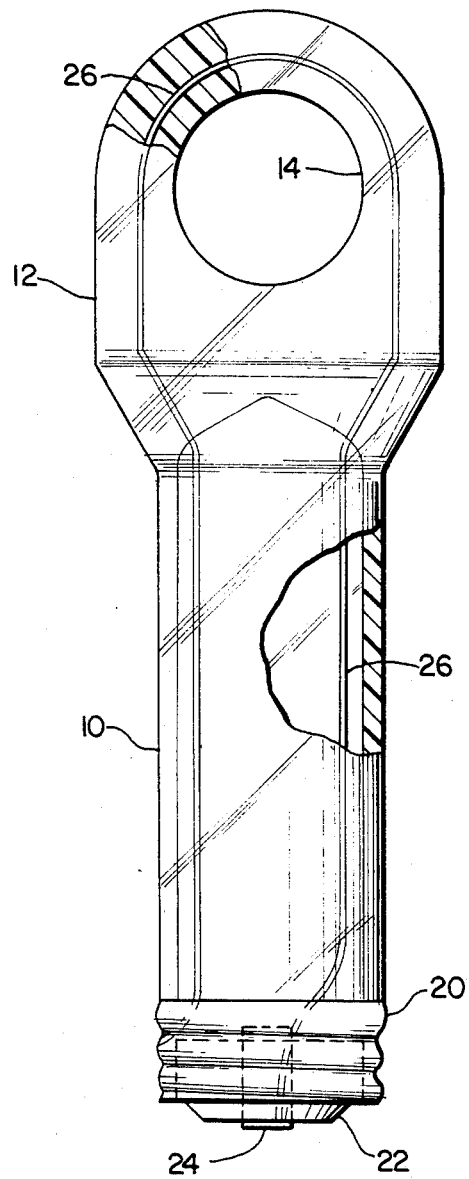
FIG. 1 is a front elevation, in partial section, of a device in accordance with the invention.
Figure 2:
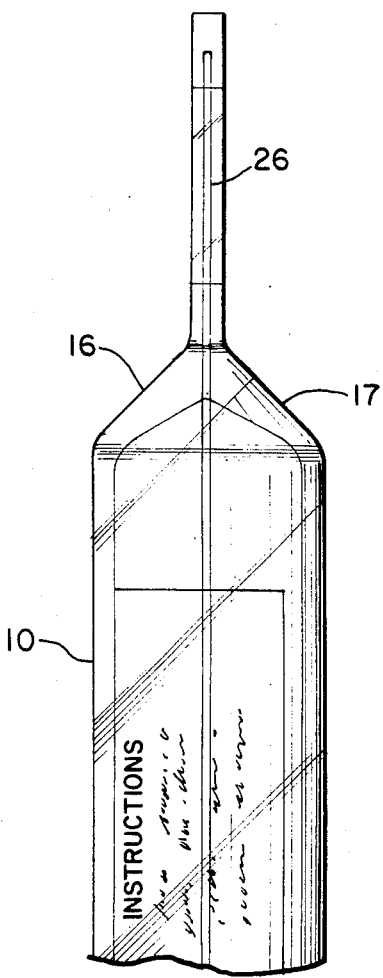
FIG. 2 is a partial side elevation of the device of FIG. 1.
Figure 3:
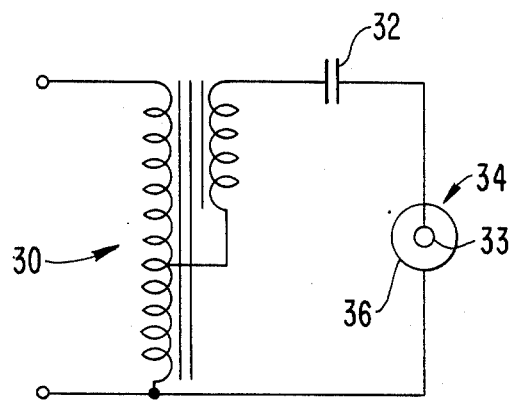
FIGS. 3-6 show lamp ballast circuits which are typical of those with which a device in accordance with the invention can be used.

As shown in FIGS. 1 and 2, a device in accordance with the invention includes a molded cylindrical body portion 10 which is unitarily formed with a flat head portion 12, the head portion being formed with a generally circular opening 14 into which the current responsive portions of a conventional clamp-on ammeter can be inserted. The head portion 12 has a thickness on the order of 0.125 to 0.250 inches and a width of about 2.25 inches, the body diameter being approximately 1.5 inches. The body and head portions are formed from a polymeric material which is preferably transparent and a good electrical insulator. Suitable plastics for this purpose are cellulose acetate or ABS. However, a rather wide variety of polymeric materials can be used depending largely on the manufacturing technique. One such technique which is usable with thermoformable plastics is to begin with a tube, flatten the heated end thereof, insert a loop of wire, finish the flattening and shaping to form head 12, and then connect the base.

The upper portion of body 10 tapers inwardly at shoulders 16,17 and the lower portion of the head tapers inwardly to smoothly conform to the body. An overall length of about 6 inches is appropriate since a tester of this type can be easily received in a number of different kinds of fixtures.

The bottom of body portion 10, in the embodiment shown, is provided with a conventional brass screw shell base 20 which is externally threaded in a conventional fashion to be received in a fixture designed to receive lamps having a mogul base. The base also includes an annular portion 22 of insulating material which is fixedly attached in shell 20, and a central contact 24 of metal, shell 20 and contact 24 forming the two portions of the connector to engage the mating portions of a receptacle in the conventional fashion. A wire 26 is contained within the device and is electrically connected at its opposite ends to contact 24 and shell 20. Between those ends the wire extends upwardly along the inner wall of body portion 10, and extends around the head portion encircling opening 14 and returning to the connection at shell 20. Wire 26 is preferably a 13 A.W.G. wire, thus forming a very low-resistance connection between contact 24 and shell 20 and, when inserted into a lamp receptacle, forming a short-circuit across the output of ballasting means connected to the lamp socket.

The current sensing portion of a conventional clamp-on ammeter can be inserted through opening 14 and, with the lamp circuit energized, can be used to measure the current flowing through wire 26 under short-circuit conditions. Each high intensity discharge lamp ballast has a known, predetermined range of output currents under short-circuit conditions. Thus, by reading this value of current, the condition of the ballasting means connected to the socket can be determined. If the ballasting means includes a starter, as would be the case for a high pressure sodium lamp, and if the output short-circuit current through wire 26 is within the range given for the specific wattage and type of lamp, then it is known that the ballast is working satisfactorily and a problem must be due to either a defective lamp or a defective starter. To determine whether the starter or lamp is defective, a known good lamp can be inserted. If the lamp does not function, then the problem clearly lies with the starter circuit.

If, on the other hand, the output short-circuit current is approximately half of the acceptable range of currents specified for the particular wattage and type of lamp and if, in addition, the ballasting means is of the constant wattage transformer type, this indicates that the capacitor which forms part of the ballasting means is defective.

Alternatively, if there is no reading for the output short-circuit current, this indicates that there is either no power to the ballasting means or the ballast itself is defective. Thus, a reading of this output short-circuit current indicates the condition of the ballasting means in a simple test. Furthermore, the test is one which can safely and easily be performed under the adverse conditions in which an electrician is often called upon to find a problem, e.g., at the top of a 40 foot pole.

Although it is not necessary to form the device of the invention from a plastic which is transparent, an additional benefit is obtained by doing so because the body portion 10 can be used to receive a printed instruction sheet which is, upon completion of the assembly, sealed within the body portion and cannot be separated therefrom and lost. This is illustrated in FIG. 2 in which a typical instruction sheet is shown. With a transparent, hollow housing as body 10, the instructions can easily be read and followed by any electrician unfamiliar with the device. As will be recognized by those skilled in this field, the clamp-on ammeter itself is a common, conventional testing instrument which is normally carried by electricians engaged in this kind of maintenance.

It will also be recognized that the particular screw base illustrated can be replaced by any form of base or connector suitable to the particular luminaire or appliance with which the testing device is to be used.

FIGS. 3-6 show examples of ballasts for various kinds and power levels of HID lamps. The ballast of FIG. 3 includes a tapped transformer 30, the primary winding of which is connected to an AC supply and the secondary winding of which is used as a reactor. The secondary is connected through a capacitor 32 to the center contact 33 of a screw-type receptacle 34 which will make contact with the usual button on the base of a lamp or with button 24 on the device of the present invention. The shell 36 of receptacle 34 is connected to the common side of the transformer and the AC supply.

Figure 4:
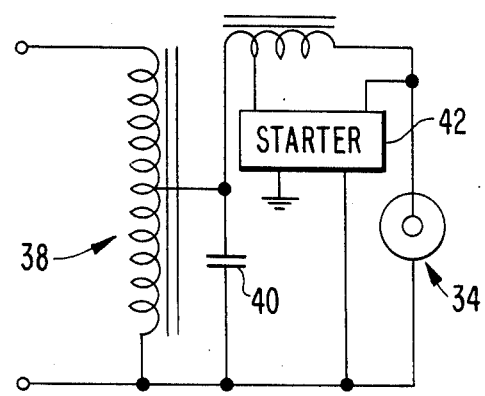

The circuit of FIG. 4 uses a tapped autotransformer 38 with a capacitor 40 connected between the tap and common. A reactor 41 is connected between the tap and receptacle 34. A conventional starter 42 is connected across the reactor and to receptacle 34.

Figure 5:
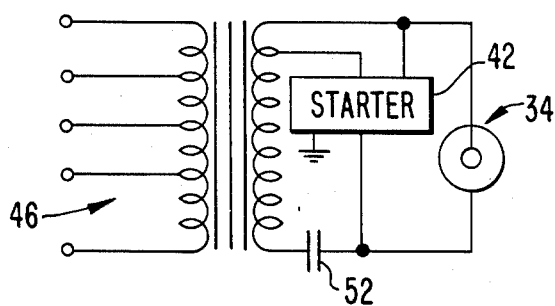
Figure 6:
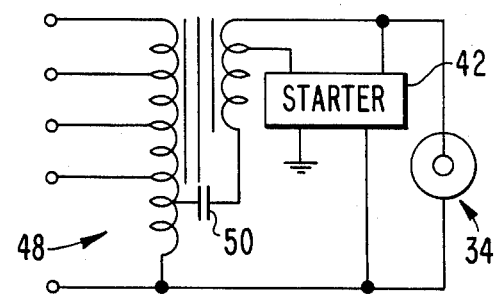

The circuits of FIGS. 5 and 6 have transformers 46 and 48 with multiply tapped primary windings, the secondary winding of transformer 48 being connected to a tap separated from common through a capacitor 50. In the FIG. 5 circuit, a capacitor 52 is connected in series with the lamp in operation. Each of these circuits also has a starter 42 connected across part of the secondary winding. The tapped primary can be connected to any of a plurality of source voltages, depending on what is available, between, e.g., 120 VAC and 277 VAC.

While certain advantageous embodiments have been chosen to illustrate the invention it will be understood by those skilled in the art that various changes and modifications can be made therein without departing from the scope of the invention as defined in the appended claims.

What I claim is:

1. A testing device for use with a clamp-on ammeter to measure the short-circuit current output of a ballast circuit connected to an HID lamp socket, comprising
    a body of electrically nonconductive material;
    a head portion fixedly attached to said body, said head portion having means defining an opening therethrough dimensioned to receive the current-sensing arms of a clamp-on ammeter;
    a base attached to said body, said base including contact portions adapted to mate and make electrical contact with the socket to be tested; and
    a low resistance wire connected at opposite ends to said connector portions of said base and extending around said opening to be coupled to said ammeter and to form a short-circuit across said socket relative to the impedance of said ballast circuit.

2. A device according to claim 1 wherein said body comprises a hollow tubular member through which said wire extends to said head portion.

3. A device according to claim 2 wherein said tubular member is formed from a substantially transparent material, said device further including an instruction sheet in said body having imprinted instructions readable through the body wall.

4. A device according to claim 2 wherein said base comprises an externally threaded conductive shell connected to one end of said wire and a central contact connected to the other end of said wire.

5. A testing device for use with a clamp-on ammeter to measure the short-circuit current output of a ballast circuit connected to an HID lamp socket, said ballast circuit having a known impedance, the testing device comprising
    a body of electrically nonconductive material;
    a head portion fixedly attached to said body, said head portion having means defining an opening therethrough dimensioned to receive the current-sensing arms of a clamp-on ammeter;
    a base attached to said body, said base including contact portions adapted to mate and make electrical contact with the socket to be tested; and
    a low resistance wire electrically connected at opposite ends to said contact portions of said base and extending around said opening to be coupled to said ammeter and to form a short-circuit across said socket, the resistance of said wire being selected to be substantially negligible relative to the impedance of said ballast circuit.

* * * * *